United States Patent [19]
Fukuda et al.

[11] Patent Number: 5,508,953
[45] Date of Patent: Apr. 16, 1996

[54] CAPACITOR, ELECTRODE STRUCTURE, AND SEMICONDUCTOR MEMORY DEVICE

[75] Inventors: Yukio Fukuda, Toukai; Katsuhiro Aoki, Tsukuba; Akitoshi Nishimura, Tsuchiura; Ken Numata, Miho, all of Japan

[73] Assignee: Texas Instruments Incorporated, Dallas, Tex.

[21] Appl. No.: 242,924

[22] Filed: May 16, 1994

[30] Foreign Application Priority Data

May 14, 1993 [JP] Japan ................... 5-136788

[51] Int. Cl.⁶ ................................. G11C 11/22
[52] U.S. Cl. .................... 365/145; 365/149; 257/295; 257/296
[58] Field of Search .................... 365/145, 149, 365/117; 257/295, 296, 298, 300

[56] References Cited

U.S. PATENT DOCUMENTS

| 5,005,102 | 4/1991 | Larson | 361/313 |
| 5,046,043 | 9/1991 | Miller et al. | 365/145 |
| 5,335,138 | 8/1994 | Sandhu et al. | 257/310 X |

FOREIGN PATENT DOCUMENTS

| 4206871 | 7/1992 | Japan | 257/295 |

*Primary Examiner*—David C. Nelms
*Assistant Examiner*—Huan Hoang
*Attorney, Agent, or Firm*—David S. Guttman; Richard L. Donaldson

[57] ABSTRACT

A capacitor and electrode structure comprising a PZT ferroelectric layer 17 with a primary component (Pb) and secondary component (Ti), a lower electrode layer 16 formed on the underside of the ferroelectric layer and made up of a special element (Pt) and Ti, and compounds thereof, and a diffusion barrier layer 18 which is formed on the underside of the lower electrode layer and which functions as a diffusion barrier with respect to Pb. The capacitor and the electrode structure, which may be a component of a semiconductor memory device, suppress fluctuations in the composition of the ferroelectric layer in PZT, etc., so as to maintain the intended performance of the PZT ferroelectric layer, thereby simplifying and stabilizing film fabrication, and preventing the degradation of electrical characteristics and adverse effects on lower layers.

7 Claims, 9 Drawing Sheets

CAPACITOR, ELECTRODE STRUCTURE, AND SEMICONDUCTOR MEMORY DEVICE

This invention pertains to a capacitor, an electrode structure, and a semiconductor memory device with a ferroelectric layer (especially a lead zirconate titanate (PZT) layer).

BACKGROUND OF THE INVENTION

An ONO layer, for example, in which $SiO_2$, $Si_3N_4$, and $SiO_2$ are successively layered, has been used for the insulating films (dielectric films) of the capacitors provided in a dynamic RAM memory cell.

However, the dielectric ratio for this ONO layer is effectively small, approximately 5; when applied to a large-capacity memory greater than 256 Mb where real estate is restricted, the capacitor dielectric film thickness is reduced, the surface is expanded, and other complex geometrical demands occur, leading to significant process problems.

In this regard, ferroelectric materials having a perovskite crystalline structure have been attracting attention as capacitor insulating film materials for future dynamic RAMS, given their extremely large dielectric ratios ranging from several hundred to several thousand.

Of these ferroelectric materials, a conventional capacitor using PZT, expressed as $Pb(Zr,Ti)O_3$, is constituted as shown below.

FIG. 13 shows a schematic view of a capacitor; in the drawing, 21 is an insulating substrate, 3 is a lower interconnecting layer (polysilicon), 13 is a barrier metal layer, 6 is a lower electrode, 7 is a PZT film, and 8 is an aluminum upper electrode.

In this capacitor, PZT film 7 is formed using the CVD method (chemical vapor deposition method), the sputtering method, or the sol-gel method; however, since PZT is an oxide, the formation is carried out in an oxygen atmosphere. That is why platinum (Pt) or palladium (Pd) metals with superior oxide resistance are used for the lower electrode 6.

In the past, however, when the formation of PZT on top of a Pt or Pd electrode was attempted, a problem arose when the basic constituent elements, lead (Pb) and titanium (Ti) in the PZT film obtained, were abnormally lacking. Therefore the residual polarization density and coercive electric field strength, which are the performance indices of a ferroelectric material, were extraordinarily degraded.

Upon consideration of the reasons why Pb and Ti were lacking in the PZT film as described above, the following factors were discovered, in accordance with the invention, as a result of material analysis.

First, with regard to Pb, it was assumed that because of the relatively high vapor pressure of Pb at the PZT formation temperature (sintering temperature), the Pb was evaporating off the film surface. However, as a result of analysis, it was found that the Pb in the PZT disperses heavily into the lower electrode and barrier layers, forming electron compounds with these, and uniform dispersion as far as the lower interconnecting polysilicon.

The reason for the lack of Ti, on the other hand, is that, at the PZT formation temperature, the barrier metal Ti interdiffuses with the lower electrode Pd and Pt, forming electron compounds with them and, in the process, the Ti molecule which is missing from the thermodynamically stable phase of the electron compound is supplied from the PZT.

FIGS. 14–20 graphically illustrate these analysis results in detail. It was found, as a result of investigating the phenomena which occur during the PZT sintering process using the SIMS method, that a complex reaction occurs between the lower electrode (Pt/Ti) and the PZT base material during the sintering process, and that a compositional disarrangement occurs between the PZT constituent elements Pb and Ti.

In the analysis, the following measurements (1)–(3) were made.

(1) A compositional analysis was performed using the X-ray diffraction method, heating Pt (film thickness of 200 nm)/Ti (film thickness of 50 nm) and $SiO_2$ (film thickness of 100 nm) on a Si substrate to 400° C., 600° C., and 800° C. for 1 h in a nitrogen atmosphere.

(2) Using a PZT amorphous powder as a sample formed by heat decomposition at 420° C. of a sol-gel solution made up of Pb (0.1 mol/L):Ti (0.05 mol/L):Zr (0.05 mol/L) and DEA (diethanolamine) (1.4 mol/L), a thermogravimetric analysis (TGA) was performed over the temperature range of room temperature to 900° C., and an investigation of the amount vaporized from the PZT powder was made.

(3) The above solution coated on the $SiO_2$/Ti/Pt film was formed on the Si substrate using the spin coating method, then sintered for 1 h at 600° C. to form 2400 Å thick PZT thin film. The concentration distribution of this sample in the depth direction was investigated using the SIMS method. Then, as shown in FIG. 18, the concentration distribution of lead in the depth direction in a dry gel film, an amorphous film, and a 1000 Å thick film of PZT was investigated using XPS.

The respective results of these measurements are explained hereinafter.

Regarding the heat reaction in the Pt/Ti film:

FIG. 14 depicts the temperature dependency of the X-ray diffraction pattern for a Pt/Ti film that is heat treated in a nitrogen atmosphere. As the temperature of the heat treatment rises, the peak strength of the $TiO_2$ (rutile) (101) diffraction and Pt (200) diffraction increases. In the sample that was heat treated at 400° C., a $Ti_6O_9$ (triclinic) (200) diffraction was observed, and in the sample that was heat treated at 800° C., a $TiO_2$(rutile) (110) diffraction was observed.

FIG. 15 depicts the X-ray diffraction pattern between 38° and 42°. In the sample that was not heat treated, 39.68° is observed as the peak for the Pt (111) diffraction. In the sample that was heat treated at 400° C., this peak shifts to the steep angle 39.86° side. In the sample that was heat treated at 600° C., it shifts to 39.96°, which is assumed to be the (004) diffraction of $Pt_3BTi$ formed in the Pt—Ti intermetallic reaction. In the sample that was heat treated at 800° C., the diffraction angle was the same 39.96°.

As described above, the reaction process which occurs when the Pt/Ti film is heat treated shows a complex temperature dependent behavior.

Regarding the thermogravimetric analysis (TGA) of PZT powder:

FIG. 16 shows the results of a thermogravimetric analysis of PZT amorphous powder formed by heat decomposition of the solution at 420° C. The loss of weight which occurs over the temperature range from room temperature to 200° C. is thought to be the result of separation of the water and $CO_2$ adsorbed by particle surfaces. No extraordinary change in weight is observed up to 700° C., but above 700° C. a small weight loss is observed. At 900° C. a 0.4 wt % weight loss is observed. Considering that Pb is 63.9 wt % of the entire $PbZr_{0.5}Ti_{0.6}O_2$ [subscript legibility is poor], it is clear that even if this weight loss is caused by Pb evaporation, it has almost no effect on the change in Pb concentration in the PZT thin film.

Regarding the SIMS PZT thin film compositional analysis: FIG. 17 shows the secondary ion strength distribution in the depth direction for Pb, Zr, Ti, and Pt as analyzed using SIMS.

a) Strength distribution of the Pb secondary ion: an extremely low value of 5–6 atm % is shown at the center of the film depth with respect to the 20 atm % in the Pb prepared composition. Looking at the substrate side, Pb goes through the Pt/Ti layer all the way to the lower layer of $SiO_2$ and the Si substrate.

b) Strength distribution of the Zr secondary ion: the distribution of the Zr secondary ion shows no dependence on depth; it is uniform. There is also little diffusion in the Pt layer, and considering the nonuniformity of the interface which occurs during sputtering at the time of analysis, the amount of dispersion of Zr in the Pt layer may be ignored.

c) Strength distribution of the Ti secondary ion: looking at the strength of the Ti and Pt secondary ions, it is clear that Ti is invading the Pt layer. Furthermore, as the X-ray diffraction results make clear, an electron compound is formed between these elements.

Regarding XPS analysis of the PZT film:

FIG. 18 shows the XPS analysis of Pb concentration in the surface region of the dry gel film, amorphous film, and PZT film formed under different conditions on the Pt/Ti film. Whereas the Pb concentration at the outermost surface is 15–21 atm %, the concentration after etching 5–120 nm falls off precipitously to 5–6 atm %, regardless of the conditions under which the film was formed. It was clear from this that the extraordinary insufficiency in Pb concentration had already occurred by the time the dry gel formation process occurred, that is at a low temperature of 170° C.

The above results led to the following determination, in accordance with the present invention.

Regarding the Pt/Ti electrode reaction:

According to the Pt/Ti equilibrium diagram shown in FIG. 19, Pt and Ti form electron compounds such as $Pt_8Ti$, $Pt_3Ti$, $Pt_5Ti_8$, PtTi, $PtTi_3$.

Regarding the reaction between PZT and the Pt/Ti film:

The behavior of Pb was considered based on the Pt-Pb equilibrium diagram shown in FIG. 20. Below 290° C., Pt and Pb form electron compounds such as $PtPb_4$, PtPb, and $Pt_3Pb$. According to the analysis results from the XPS mentioned above, Pb diffuses toward Pt at 170° C., the temperature at which the dry gel is formed, but according to the SIMS results, it is not accumulated in the Pt This suggests that at 600° C., $PtTi_x$ is more layer. thermodynamically stable than $PtPb_x$.

Regarding the phenomenon by which the Pb concentration is lower than the prepared composition, it is generally thought that, during sintering, this occurs as evaporation from the PZT film surface in the form of Pb or PbO. However, the amount evaporated from the PZT surface is minute, and judging from the results above, almost all of it is diffused into the substrate. Furthermore, from the fact that Pb is detected in the Si as well, the Pb which passes through the Pt/Ti layer goes into solid solution in the $SiO_2$, and further diffuses in the Si substrate.

Ti behavior can be surmised from the Pt—Ti equilibrium diagram shown in FIG. 19. The Pt and Ti in the substrate primarily form $Pt_8Ti$ under heat treatment. When a thin film of PZT is sintered on top of the Pt/Ti film, it appears that an electron compound of Pt and Ti is formed, while at the same time the Ti is absorbed in the Pt layer in the PZT film, forming an electron compound. Therefore in order to prevent a diminution of Ti concentration in the PZT film, it is necessary to make the Pt film thickness as absolutely thin as possible, and to consider the scaling of Ti when establishing the prepared composition of sol-gel base material.

Above, the SIMS, XPS, and XRD analysis of the reactions which occur during the process of formation of PZT thin film on a Pt/Ti film have been discussed. To summarize, the composition of PZT film formed by the sol-gel method, in particular, is greatly influenced by the diffusion of Pb into the substrate side and the reaction between Ti and Pt which accompanies heat treatment. In particular, the Pb diffusion phenomenon is extraordinary at a temperature around 170° C. The decrease in Ti concentration is caused by the alloy reaction which occurs with Pt during sintering. Also, the Zr in the PZT film is extremely stable with respect to the Pt layer.

It is an object of this invention to provide a capacitor, an electrode structure, and a semiconductor memory device capable of suppressing fluctuations in the composition of the ferroelectric layer in PZT, etc., so as to maintain its intended performance, of simplifying and stabilizing film fabrication, and of preventing the degradation of electrical characteristics and adverse effects on lower layers.

SUMMARY OF THE INVENTION

The invention pertains to a capacitor with a primary electrode layer and a ferroelectric film formed so as to be in contact with the primary electrode layer and containing at least a primary and a secondary component; a secondary electrode layer formed as the electrode opposite the primary electrode, separated by the ferroelectric film, and made up of at least one of the following: a special element with the primary component and/or the secondary component and compounds thereof, and a diffusion barrier layer formed so as to be in contact with the secondary electrode layer and so as to function as a diffusion barrier with respect to the primary component.

In the capacitor, in accordance with the invention, it is desirable that the ferroelectric film be a lead zirconate titanate layer containing a primary component formed of lead and a secondary component formed of titanium, and that the secondary electrode layer be an electron compound of platinum and/or palladium with lead and/or titanium, and that the diffusion barrier layer be formed of tungsten and/or lutetium. That is, the secondary electrode layer 16 (see FIGS. 1 & 2) can for example be (A) an electron compound of platinum with lead, or an electron compound of platinum with titanium, or an electron compound of platinum with lead and titanium; (B) an electron compound of palladium with lead, or an electron compound of palladium with titanium, or an electron compound of palladium with lead and titanium; of (C) an electron compound of platinum and palladium with lead, or an electron compound of platinum and palladium with titanium, or an electron compound of platinum with lead and titanium. The diffusion barrier layer 18 can be formed of tungsten or lutetium, or a combination of tungsten and lutetium.

It is also preferable for the lead or other constituent element in the ferroelectric film to be added to the electrode layer.

It is preferable to form a barrier metal layer so as to surround the diffusion barrier layer and be on the side opposite the secondary electrode layer, comprising at least one of the following: titanium and/or a titanium alloy with tantalum and/or a tantalum alloy.

In accordance with the invention, an electrode structure is provided with the above secondary electrode layer and a diffusion barrier layer, and, preferably, the above barrier metal layer.

Furthermore, the invention provides a capacitor and/or a semiconductor memory unit, such as a dynamic RAM, with an electrode structure as described above.

Figure 1:
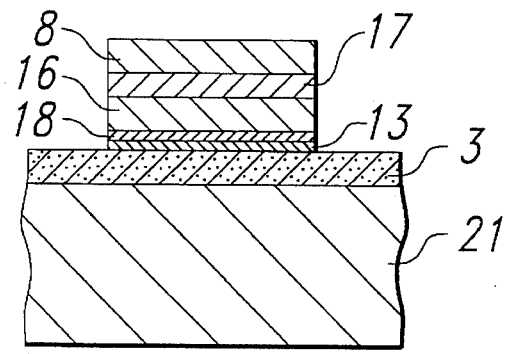
FIG. 1 is a cross-sectional view of a capacitor in one embodiment of the invention.

Reference numerals and symbols as shown in the drawings:
1—substrate
3—$n^+$-type source region
4—$n^+$-type drain region
6,16—lower electrode
7,17—ferroelectric film (PZT thin film)
8—upper electrode
13—barrier metal layer
18—diffusion barrier layer
21—insulating substrate
CAP—capacitor
TR—transfer gate
M-CEL—memory cell.

DESCRIPTION OF PREFERRED EMBODIMENTS

FIG. 1 illustrates one example of a capacitor using a PZT ferroelectric film as constructed in accordance with the invention.

Figure 13:
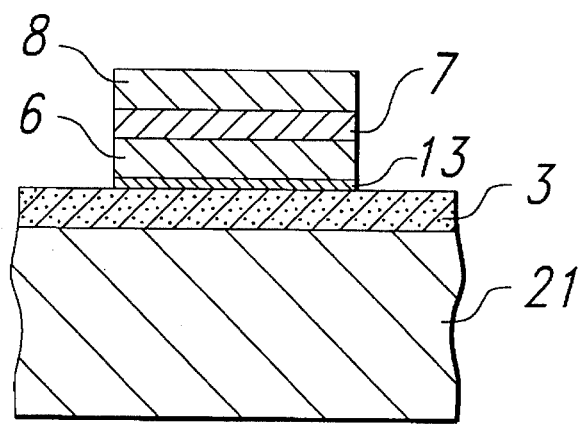
FIG. 13 is a cross-sectional view of a conventional capacitor.
Figure 14:
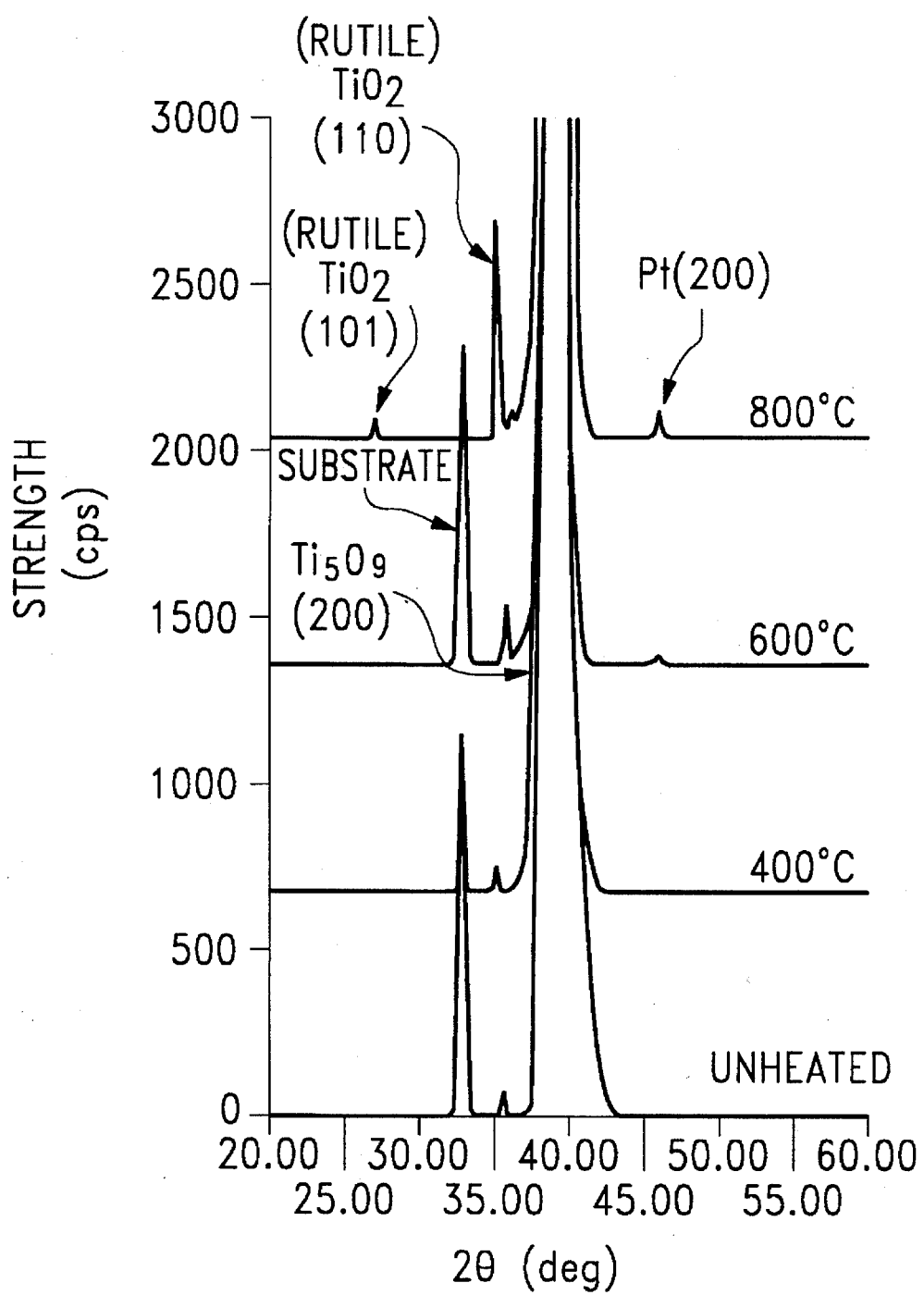
FIG. 14 is a graph showing X-ray diffraction spectra for a Pt/Ti film.
Figure 15:
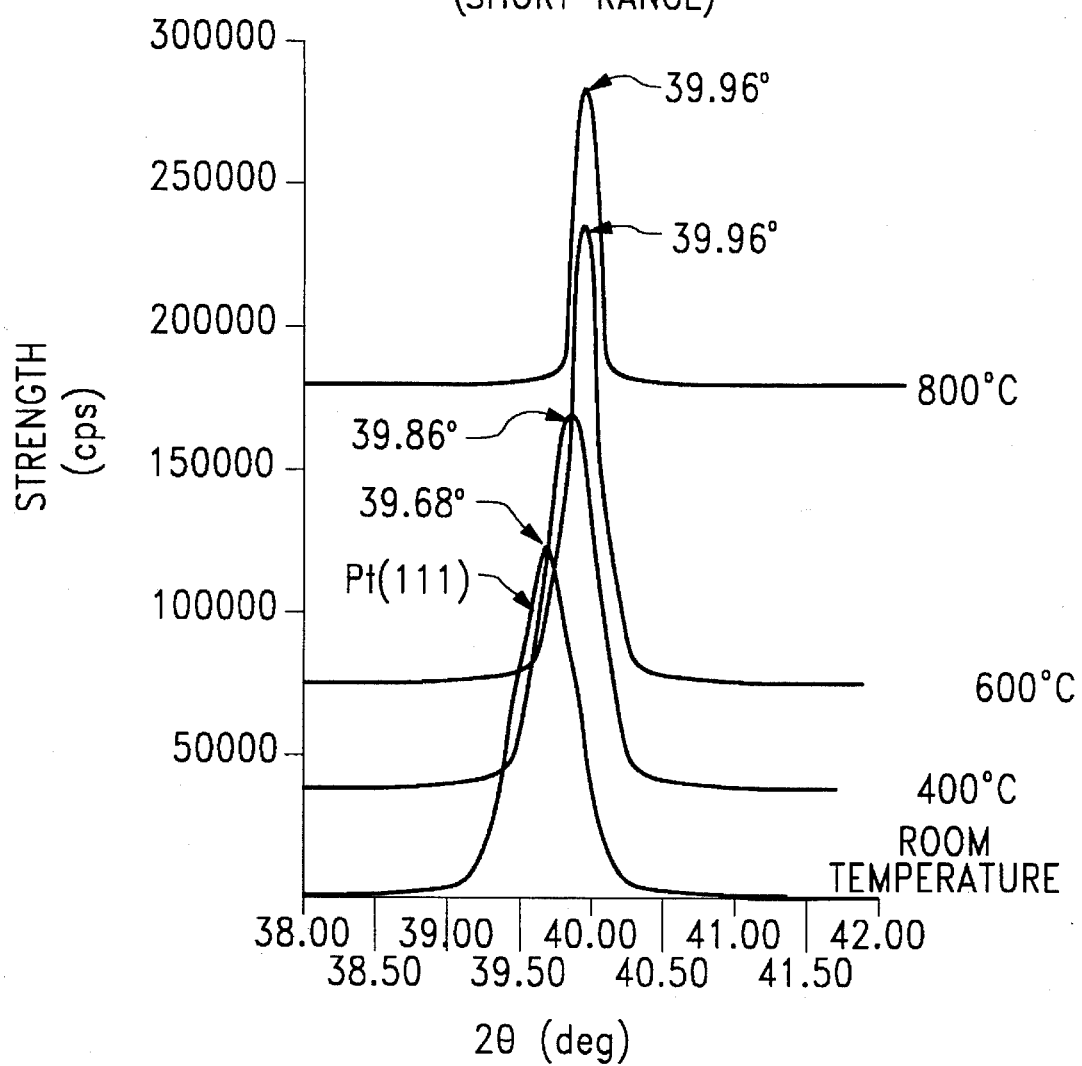
FIG. 15 is a graph showing other X-ray diffraction spectra for the Pt/Ti film.
Figure 16:
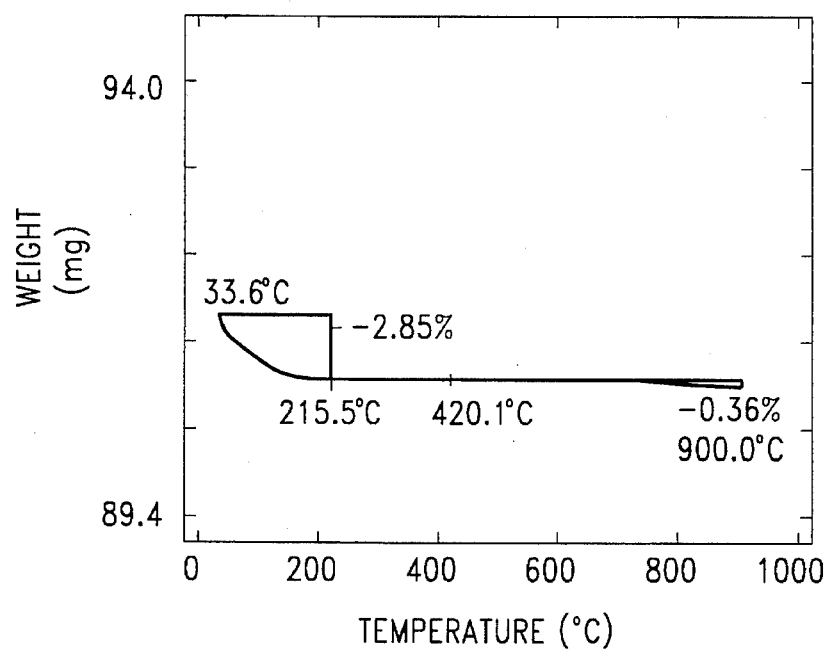
FIG. 16 is a graph showing thermogravimetric analysis (TGA) caused by drying temperature when the PZT thin film is formed using the sol-gel method.

The special constitution of the capacitor of FIG. 1 is that, compared to the conventional example shown in FIG. 13, the lower electrode 16 with respect to ferroelectric layer 17 formed of lead zirconate titanate (PZT), is made up of platinum (Pt), titanium (Ti) and electron compounds thereof, and that a tungsten (W) layer 18 is provided beneath the lower electrode 16 which functions as a diffusion barrier with respect to lead (Pb).

Figure 2:
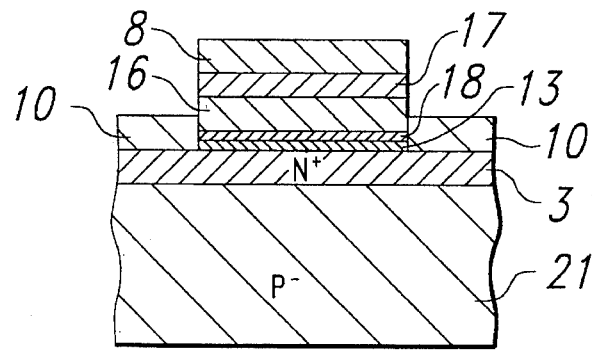
FIG. 2 is a cross-sectional view of the capacitor of FIG. 1 in another embodiment in accordance with the invention.

Inasmuch as barrier metal layer 13, of titanium and/or a titanium alloy (for example, titanium nitride (TIN)), is erected between diffusion barrier layer 18 and lower interconnecting layer 3, and the upper electrode 8 is formed of aluminum (or Ti), the structure is the same as conventional examples. Lower interconnecting layer 3 may be formed of a polysilicon layer; however, as FIG. 2 shows, it may also be, for example, an $n^+$-type semiconductor region 3, formed by diffusion on a p-type silicon substrate 1 with an insulating film 10 disposed thereon, where the capacitor is in engagement with the n+-type semiconductor region 3.

The ferroelectric film (PZT film) 17 can be fabricated by the sol-gel method described hereinafter, or by CVD or sputtering to produce a film thickness of 500–100,000 Å. Also, the film thickness of the lower electrode 16 is preferably 500–10,000 Å.

It is preferable that the film thickness of the diffusion barrier layer 18 be 100–10,000 Å, and that the film thickness of barrier metal layer 13 be 100–100,000 Å. Layers 18, 13, and 8 can be formed using the known methods of sputtering or vacuum vapor deposition.

In this example, as described above, the presence of diffusion barrier layer 18 makes it possible to effectively prevent or reduce the diffusion of Pb, the base metal component, from lower electrode 16 to barrier metal layer 13 and, furthermore, to lower interconnecting layer 3 and silicon layer 1 during the formation of PZT film 17 (e.g., during film drying and oxide sintering).

Because lower electrode 16 is formed from an electron compound of Pt and Ti, these lower electrode constituent metallic elements already act as a thermodynamically stable phase, so there is a fully sufficient presence of Ti molecules. As a result, there is no supply of Ti molecules from PZT film 17 to lower electrode 16, or the amount supplied is greatly reduced.

Figure 3:
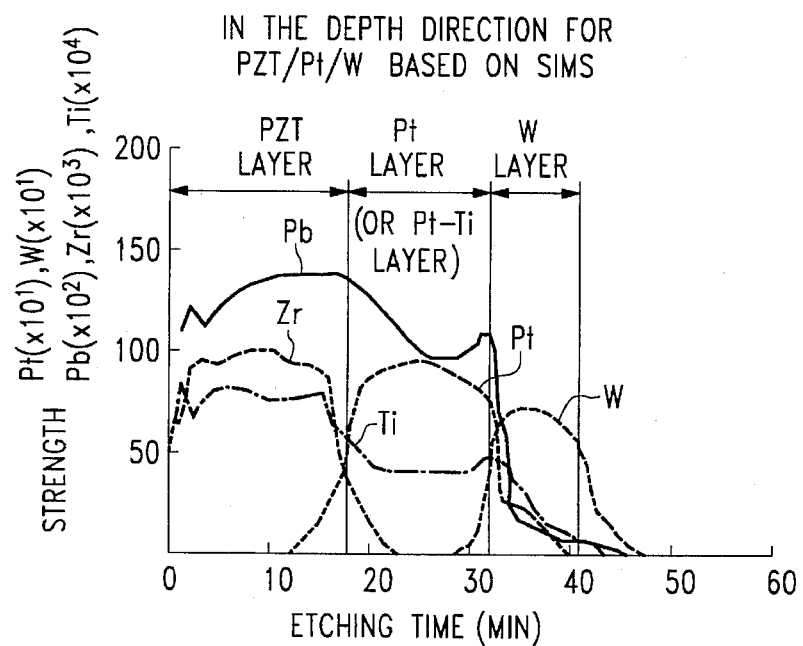
FIG. 3 is a graph showing secondary ion strength distribution in the depth direction for the capacitor in accordance with the invention.
Figure 17:
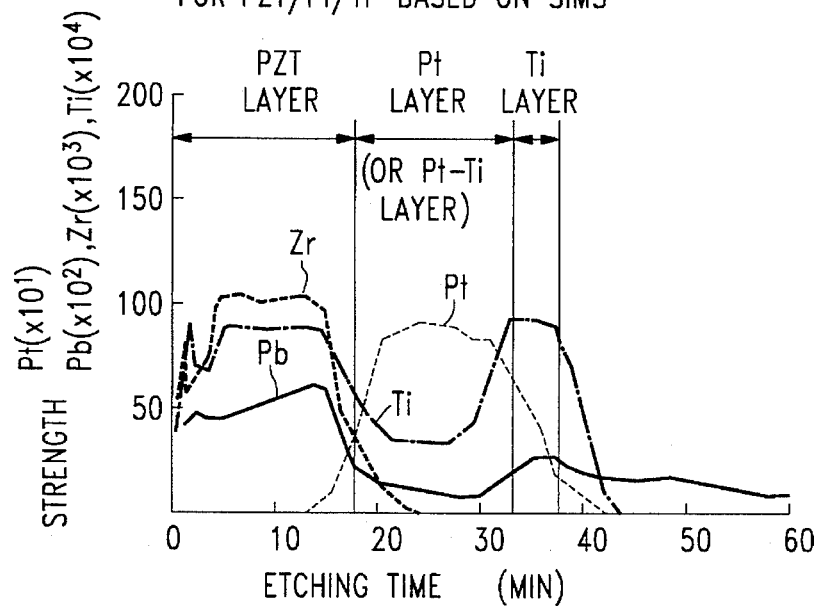
FIG. 17 is a graph showing secondary ion strength distribution in the depth direction.
Figure 18:
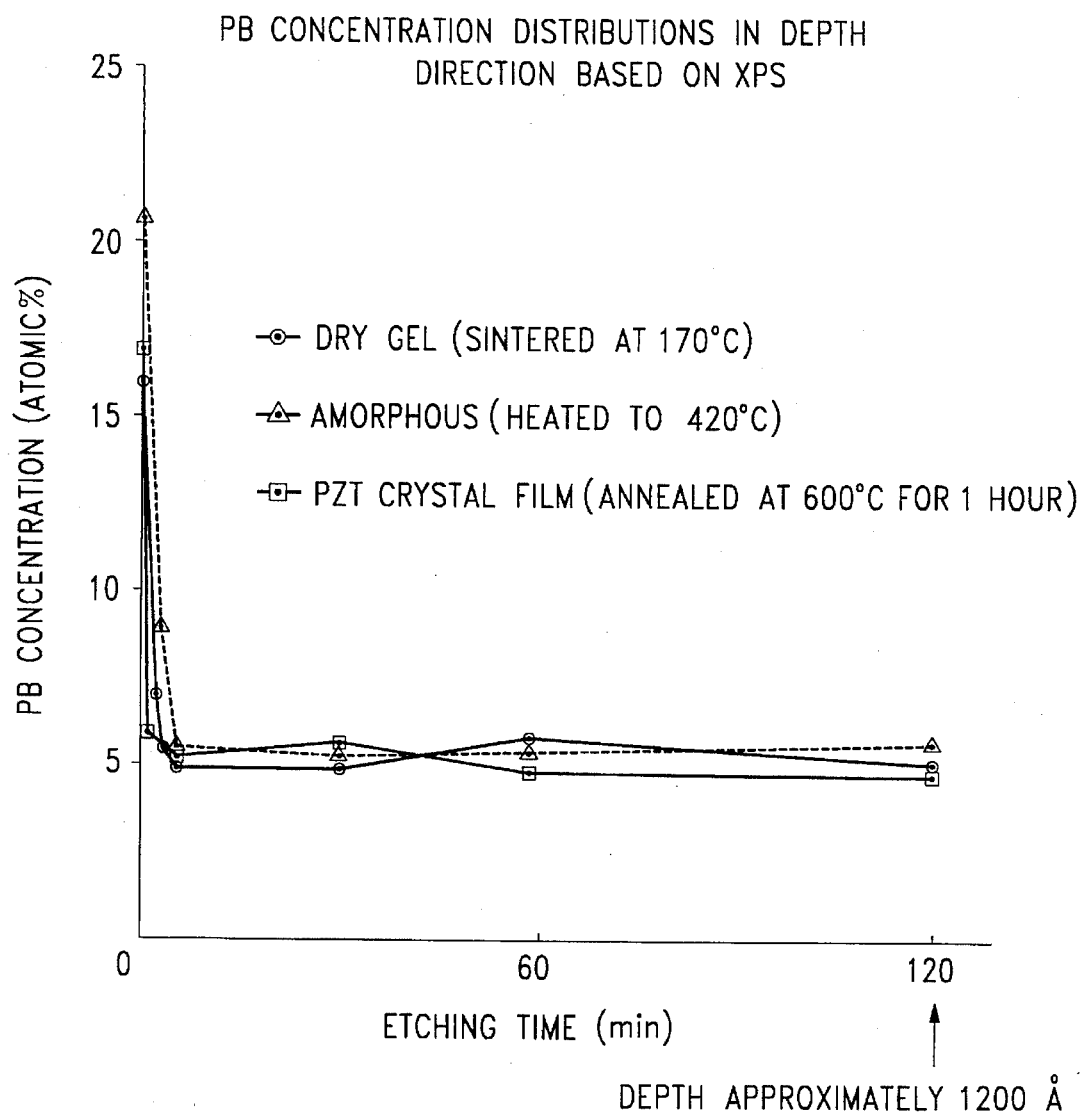
FIG. 18 is a graph of Pb concentration distribution in the depth direction obtained under different conditions.
Figure 19:
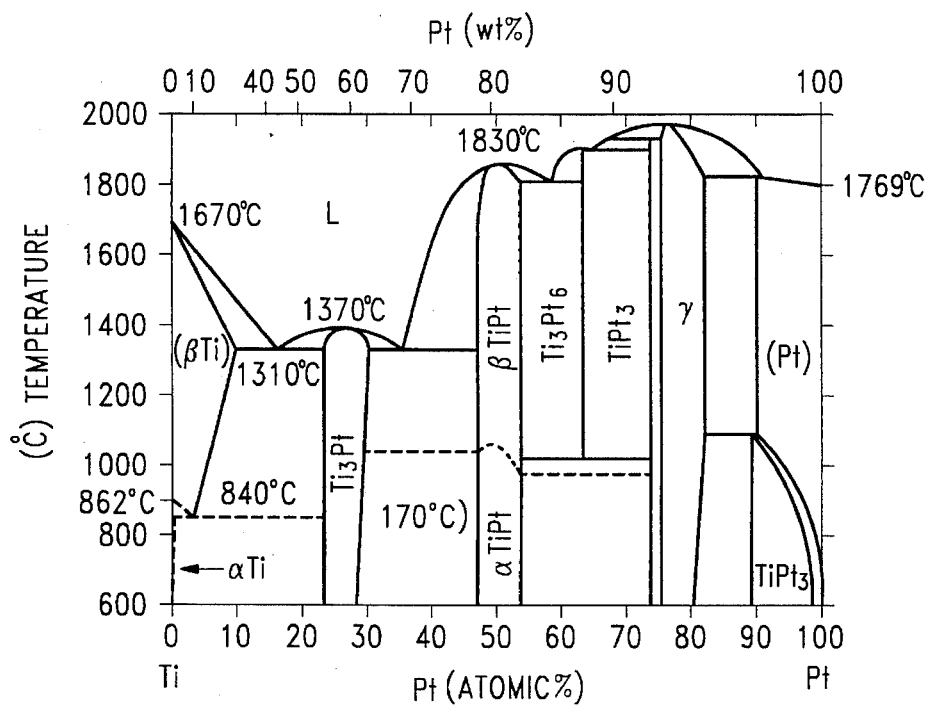
FIG. 19 is a graph of the Pt-Ti equilibrium state.
Figure 20:
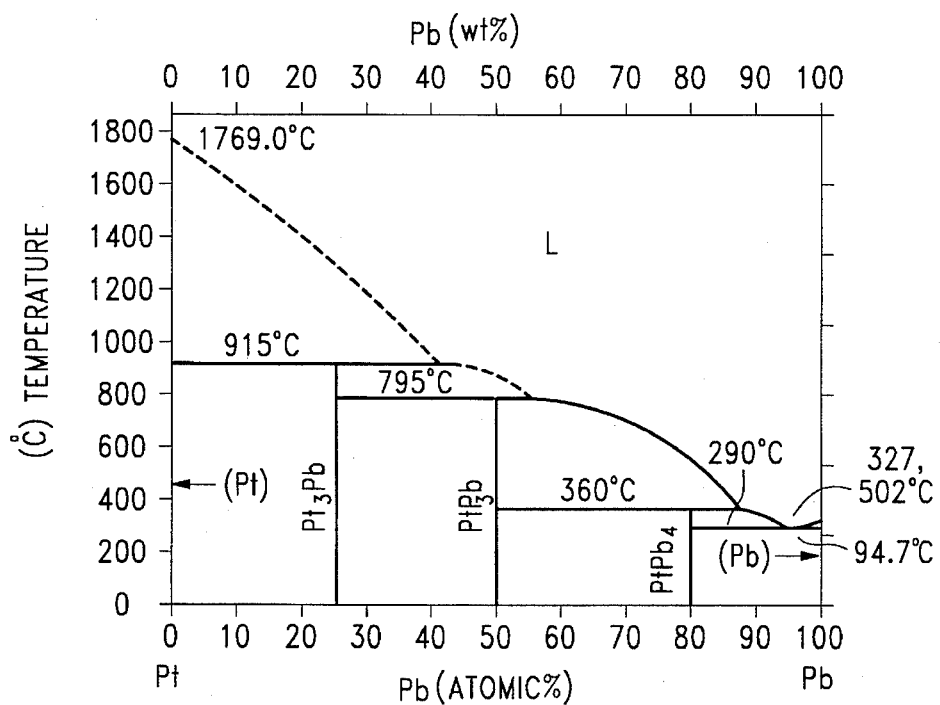
FIG. 20 is a graph of the Pt-Pb equilibrium state.

FIG. 3 shows the results of an analysis of secondary ion strength distribution in the depth direction for Pb, Zr, Ti, Pt, and W with respect to the structure of the capacitor of this embodiment, following the example shown in the graph of FIG. 17. The following points are clear from this analysis.

a) Strength distribution of the Pb secondary ion: compared with that shown in FIG. 17, the Pb secondary ion strength distribution in the PZT layer is higher, and a reduction is not observed; Pb is remarkably reduced in the W layer, and does not reach the lower layer $SiO_2$ or Si substrate, so the W layer Pb barrier is highly effective.

b) Strength distribution of the Zr secondary ion: Zr shows no dependence on depth; it is uniform. There is also little diffusion in the Pt-Ti layer, and the amount of dispersion of Zr in the Pt layer may be ignored.

c) Strength distribution of the Ti secondary ion: strength of the Ti secondary ions in the PZT layer is virtually unchanged in comparison with that shown in FIG. 17.

From the above results, it will be seen that the following striking effects (1)–(5) are achieved with the capacitor and electrode structure of this embodiment.

(1) The composition of the PZT film is maintained, and because a stoichiometric ferroelectric thin film is obtained, superior electrical characteristics are also achieved (high residual polarization density, low coercive electric field strength, low leakage current density, high insulating voltage resistance, etc.).

(2) Because there is no need to supply excess Pb and Ti during the formation of the ferroelectric thin film, film fabrication is simplified and stabilized.

(3) Generally, when the constituent element of the ferroelectric material diffuses to the silicon substrate, it causes degradation of electrical characteristics; this will be prevented.

(4) Since Ti diffusion is effectively prevented, even if the lower electrode is thin, the thickness of the lower electrode can be made as thin as possible, so the amount of the precious metal Pt required can be reduced.

(5) An electrode structure which is both very simple and stable can be adopted with respect to formation of the ferroelectric film.

Figure 4:
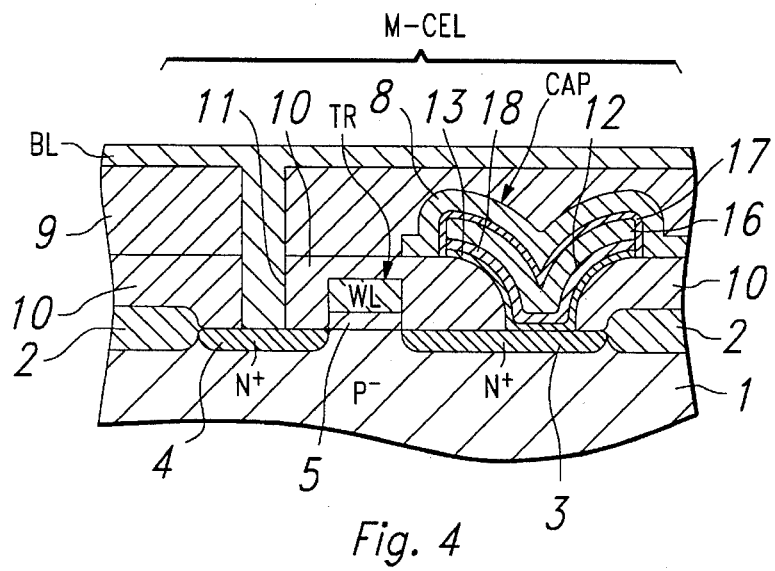
FIG. 4 is an enlarged cross-sectional view of a dynamic RAM memory cell incorporating a capacitor using PZT thin film in accordance with the invention (taken along section line IV—IV in FIG. 5).
Figure 5:
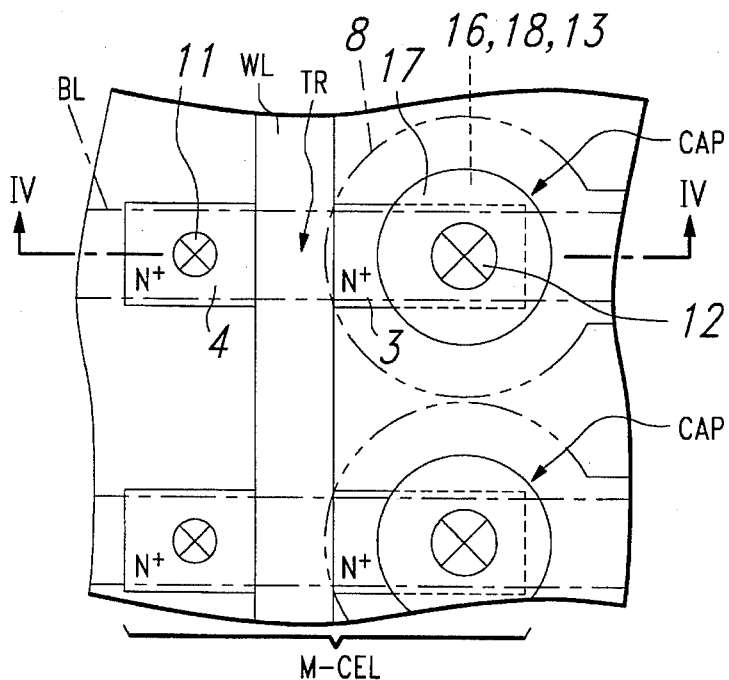
FIG. 5 is an enlarged plan view of the same memory cell.

Because of the remarkable effects provided as described hereinabove, the capacitor and electrode structure of this embodiment are extremely beneficial for use as memory cell capacitors (for example, in stack-type configurations) in semiconductor memory device RAMs. FIGS. 4 and 5 depict an example of a dynamic RAM memory cell.

On the main surface of a $p^-$-type silicon substrate 1, device regions divided by field oxide film 2 are formed, and a memory cell M-CEL comprising a transfer gate TR, made up of MOS transistors, and capacitor(s) CAP is provided.

In transfer gate TR, $n^+$-type source region 3 and $n^+$-type drain region 4 are respectively formed by diffusion of impurities, a word line WL is erected between these two regions through gate oxide film 5, and a bit line BL is connected to the drain region 4 through $SiO_2$ or other insulating layers 9 and 10, and contact hole(s) 11.

The capacitor CAP is a stack type, having barrier metal layer 13, diffusion barrier layer 18, and lower electrode 16 connected to source region 3 through contact hole(s) 12 of insulating layer 10, with PZT ferroelectric film 17 and upper electrode 8 being successively layered on the lower electrode 16.

Capacitor CAP constituent ferroelectric film 17 uses the base solution described below to make a 2400 Å thick PZT by the sol-gel method, that is from a Pb(ZR, Ti)$O_3$ layer. Lower electrode 16 is made up of a 2000 Å thick film of Pt, Ti, and electron compounds thereof, and diffusion barrier layer 18 is made up of a 1000 Å thick W layer; barrier metal layer 13 is made up of a 1000 Å thick Ti layer. Upper electrode 8, which contacts the ferroelectric film, is made up of a 10,000 Å thick aluminum (or Pt) layer.

Next, the method by which memory cell M-CEL is fabricated will be described, with reference to FIGS. 6–12.

Figure 6:
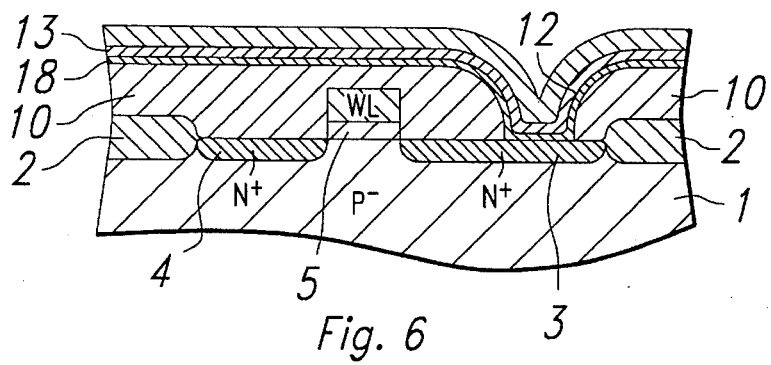
FIG. 6 is an enlarged cross-sectional view showing a manufacturing step of the fabrication method for the same memory cell.

First, as shown in FIG. 6, a field oxide film 2 is formed on $p^-$-type silicon substrate (wafer) 1 using a selected oxidation method. A gate oxide film 5 is formed using the thermal oxidation method, and a polysilicon word line WL is formed using the chemical vapor deposition method. Next, an $n^+$-type source region 3 and drain region 4 are respectively formed by heat diffusion of As or another n-type impurity.

Next, contact holes 12 are formed on source region 3 using photolithography with respect to the $SiO_2$ insulating layer 10 accumulated over the whole surface by chemical vapor deposition.

Ti barrier metal layer 13, W diffusion barrier layer 18, and Ti/Pt lower electrode layer 16 are now successively sputtered on the whole surface so as to form a junction with source region 3 at contact hole(s) 12.

Figure 7:
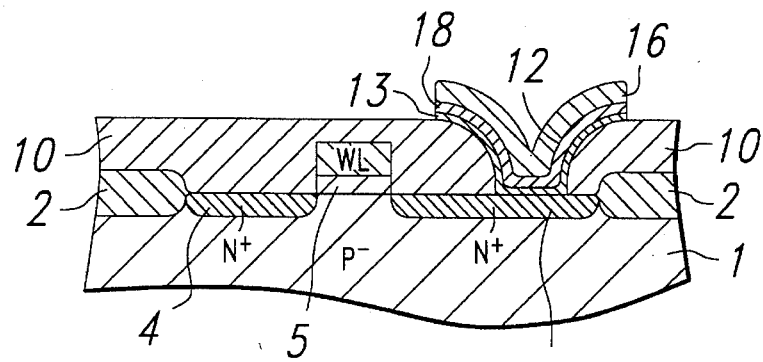
FIG. 7 is an enlarged cross-sectional view showing another manufacturing step of the fabrication method for the same memory cell.

These layers are then given the same pattern using photolithography, as shown in FIG. 7.

Figure 8:
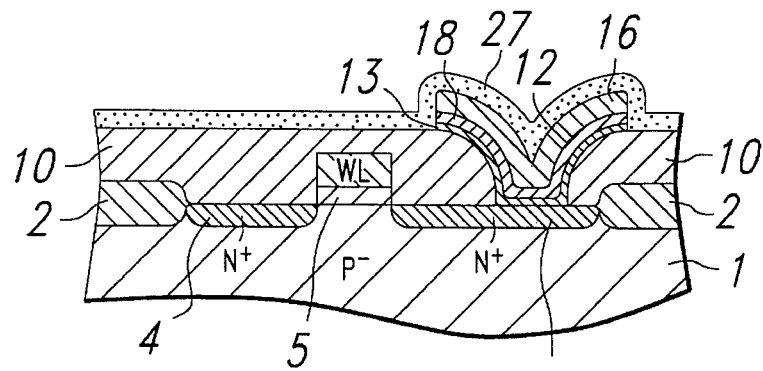
FIG. 8 is an enlarged cross-sectional view showing another manufacturing step of the fabrication method for the same memory cell.

Next, as shown in FIG. 8, the spin coating method or dip coating method is used to coat sol-gel base solution 27 on the whole surface, including lower electrode 16. These constituent metallic element organometallic compounds in base solution 27 are then diluted with the solvent $CH_8OC_2H_4OH$ (methoxyethanol) in the following quantities: $Pb(CH_3COO)_2 \cdot 3H_2O$ (lead acetate): 0.10 tool/L; Ti $(i-OC_3H_7)_4$ (titanium isopropoxide): 0.05 mol/L; Zr $(i-OC_3H_7)_4$ (zirconium isopropoxide): 0.05 mol/L; and the stabilizer $NH(C_2H_4OH)_2$ (diethanolamine: DEA): 1.4 mol/L.

Figure 9:
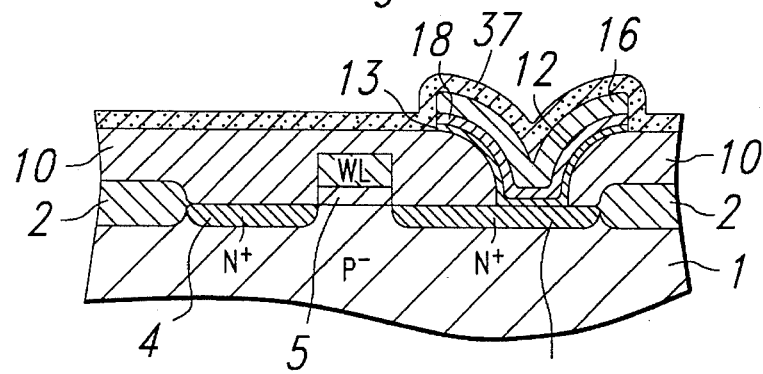
FIG. 9 is a an enlarged cross-sectional view showing another manufacturing step of the fabrication method for the same memory cell.

Next, the wafer coated with base solution 27 is heated to a specified temperature (from 100°–300° C., in particular 130°–200° C.) to dry the coated solution, and a dry gel film 37 is formed as shown in FIG. 9.

Figure 10:
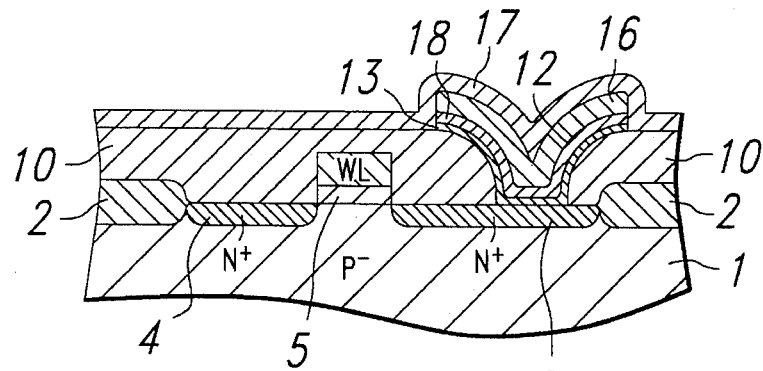
FIG. 10 is an enlarged cross-sectional view showing another manufacturing step of the fabrication method for the same memory cell.

The dried wafer is now oxide sintered at the temperature at which perovskite crystals form, thus forming a ferroelectric thin film 17 over the whole surface, as shown in FIG. 10.

Figure 11:
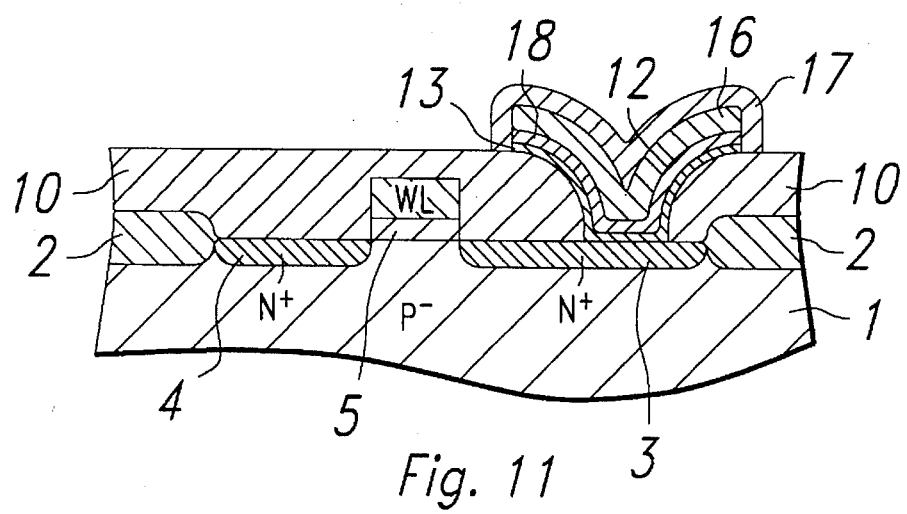
FIG. 11 is an enlarged cross-sectional view showing another manufacturing step of the fabrication method for the same memory cell.

Now, as shown in FIG. 11, the unnecessary parts of ferroelectric thin film 17 formed over the whole surface are removed by dry etching or another method to form a specified pattern of the PZT ferroelectric film 17 on lower electrode 16.

Figure 12:
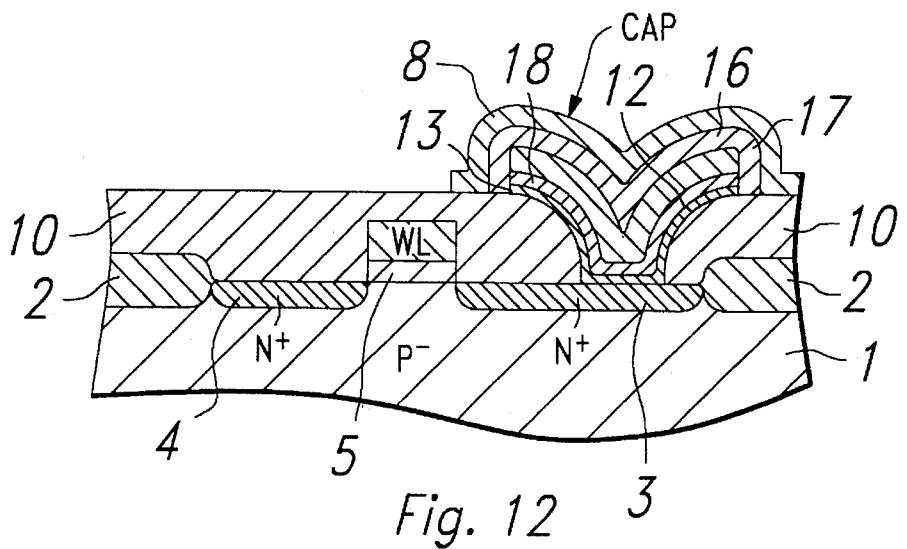
FIG. 12 is an enlarged cross-sectional view showing still another manufacturing step of the fabrication method for the same memory cell.

Finally, as shown in FIG. 12, photolithography is used to form upper electrode 8 on the junction with ferroelectric film 17 in a specified pattern. When upper electrode 8 is formed, the Pt layer, and then the W diffusion barrier layer (neither is shown in the diagram) are formed on PZT ferroelectric film 17 in such a way that the side walls thereof are covered; after formation of the metal, for example, aluminum (or Pt) which serves as the upper electrode 8 by sputtering, etc., a specified pattern can be formed for an even more desirable embodiment.

An embodiment of the invention has thus been explained, but this embodiment can take other forms based on the technical aspects of the invention.

For example, the diffusion barrier layer 18 could be formed of ruthenium (Ru) or compounds thereof rather than W.

Also, the lower electrode layer 16 could, in addition to Pt—Ti, also make use of electron compounds of Ti and palladium (Pd), which is thermodynamically stable at the formation temperature of the ferroelectric thin film; a Pt—Pd—Ti 3-element structure would also work. It is expected that forming the lower electrode of PtPb, Pd—Pb, or Pt—Pb—Ti, diffusion of Pb could be prevented even further.

Mixing into the lower electrode layer (for example, Pt—Ti, Pd—Ti or other electron compounds) of the constituent elements (for example, Pb, Sr, Ba, etc.) of the ferroelectric material that one is trying to form is also effective in preventing diffusion of the same.

The barrier metal layer is not limited to Ti, and may be formed of tantalum (Ta) and/or tantalum alloys, Ti—Ta, or other metals.

In the example as described, barrier metal layer 13 was erected under diffusion barrier layer 18, but it is also possible to reverse this and erect diffusion barrier layer 18 under barrier metal layer 13. Many other variations beyond those described are also possible, beginning with the material used for the capacitor constituent layers, and including patterns in the capacitor itself, interconnecting and connecting structure, etc. Also, in addition to the vertical layer structure of the capacitor described above, that layering direction may also have several variations.

The methods used to form each of the above-described layers may also be varied. For PZT film 17, for example, as a component of the sol-gel base solution, in addition to lead acetate, 2-ethyllead hexanoate, lead naphthenate, and other lead fatty acids, and lead di-n-butoxide, lead di-n-pentoxide and other lead alkoxides may be used.

Other than titanium isopropoxide, titanium tetra-n-butoxide, titanium tetra-n-pentoxide, and other titanium alkoxides may be used, as can 2-ethyltitanium hexanoate, titanium naphthenate, and other titanium fatty acid salts.

Other than zirconium isopropoxide, zirconium salts such as zirconium tetra-n-butoxide, zirconium tetra-n-pentoxide and other zirconium alkoxides, and 2-ethylzirconium hexanoate, zirconium naphthenate, and other zirconium fatty acid salts may be used.

In addition to DEA, dipropanolamine, triethanolamine, and other alkanolamines, as well as acetyl acetone and other β-diketones can be used alone or in combination.

In addition to methoxyethanol, isopropanol, n-butanol, etc., may be used as the base solution solvent.

The PZT film may be formed by sputtering, CVD, etc., in addition to the sol-gel method. Other constituent layers of the capacitor can also be formed by various methods.

Beginning with PZT, the composition of the ferroelectric body used in the invention may be varied. This is not limited to the above-described stack-type capacitor; the above-described stack-type capacitor may also be erected on a $SiO_2$ film, and the lower electrode of this capacitor may extend such that it connects with the transfer gate source region. Alternatively, a capacitor structure in which the capacitor is built into a trench may also be applied. The above-described electrode structure may also be applied in places other than semiconductor memories.

The invention, as described concerns a capacitor having a primary electrode layer and a ferroelectric layer formed so as to be in contact with the primary electrode layer and containing at least a primary and a secondary component; a secondary electrode layer formed as the electrode opposite the primary electrode, separated by the ferroelectric layer, and made up of at least one of the following: a special element with the primary component and/or the secondary component and compounds thereof, and a diffusion barrier layer formed so as to be in contact with the secondary electrode layer and so as to function as a diffusion barrier with respect to the primary component. The existence of the diffusion barrier layer makes it possible to effectively prevent or reduce dispersion of the primary component, which is the basis component, through the secondary electrode layer.

Because the secondary electrode layer is made up of the components or compounds described above, the constituent elements of the secondary electrode layer already serve as a thermodynamically stable phase, the result of which is that the supply of primary or secondary components from the ferroelectric layer is prevented or greatly reduced.

Therefore, the composition of the PZT film is maintained, and because a stoichiometric ferroelectric thin film is obtained, superior electrical characteristics are also achieved (high residual polarization density, low coercive electric field strength, low leakage current density, high insulating voltage resistance, etc.), while at the same time, because there is no need to supply excess primary or secondary components during the formation of the ferroelectric layer, film fabrication is simplified and stabilized, and the diffusion of constituent elements of the ferroelectric material can be prevented and its electrical characteristics preserved, making it possible to form an electrode structure which is simple and stable with respect to formation of the ferroelectric layer.

We claim:

1. A capacitor comprising:
    an electrically interconnecting layer;
    a barrier metal layer deposited on the interconnecting layer to prevent oxidation of the interconnecting layer;
    an oxidation-resistant lower electrode disposed above the barrier metal layer;
    a dielectric film of high dielectric constant, comprising primary and secondary components, deposited on the lower electrode;
    an upper electrode deposited on the dielectric film; and
    a diffusion barrier layer interposed between the barrier metal layer and the lower electrode, comprising a material preventing the primary component of the dielectric film from diffusing into the electrically interconnecting layer.

2. The capacitor of claim 1 wherein the dielectric film comprises a ferroelectric material having Pb as the primary component, and the diffusion barrier layer comprises tungsten for preventing Pb from diffusing from the dielectric film to the electrically interconnecting layer.

3. The capacitor of claim 1 wherein the electrically interconnecting layer comprises polysilicon, the dielectric film comprises a ferroelectric material having Pb as the primary component, and the diffusion barrier layer comprises tungsten for preventing Pb from diffusing from the dielectric film to the electrically interconnecting layer.

4. The capacitor of claim 1 wherein the electrically interconnecting layer comprises an $n^+$-type silicon, the dielectric film comprises a ferroelectric material having Pb as the primary component, and the diffusion barrier layer comprises tungsten for preventing Pb from diffusing from the dielectric film to the electrically interconnecting layer.

5. The capacitor of claim 1 wherein the interconnecting layer is formed on an insulating substrate.

6. The capacitor of claim 1 wherein the barrier metal layer is formed to surround the diffusion barrier layer.

7. A semiconductor memory cell comprising:
    a transistor memory circuit; and
    a capacitor coupled to the transistor circuit, the capacitor comprising:
        an electrically interconnecting layer,
        a barrier metal layer deposited on the interconnecting layer to prevent oxidation of the interconnecting layer,
        an oxidation-resistant lower electrode disposed above the barrier metal layer, a dielectric film of high dielectric constant, comprising primary and secondary components, deposited on the lower electrode, an upper electrode deposited on the dielectric film, and a diffusion barrier layer interposed between the barrier metal layer and the lower electrode, comprising a material preventing the primary component of the dielectric film from diffusing into the electrically interconnecting layer.

* * * * *